United States Patent
Park et al.

(10) Patent No.: US 9,859,204 B2
(45) Date of Patent: Jan. 2, 2018

(54) SEMICONDUCTOR DEVICES WITH REDISTRIBUTION PADS

(71) Applicant: Samsung Electronics Co., Ltd., Suwon-si, Gyeonggi-do (KR)

(72) Inventors: Myeong Soon Park, Goyang-si (KR); Hyunsoo Chung, Hwaseong-si (KR); Won-young Kim, Yongin-si (KR); Ae-nee Jang, Seoul (KR); Chanho Lee, Gwangmyeong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/230,889

(22) Filed: Aug. 8, 2016

(65) Prior Publication Data

US 2017/0084559 A1   Mar. 23, 2017

(30) Foreign Application Priority Data

Sep. 17, 2015   (KR) .......................... 10-2015-0131832

(51) Int. Cl.
*H01L 23/50* (2006.01)
*H01L 23/00* (2006.01)

(52) U.S. Cl.
CPC ............. *H01L 23/50* (2013.01); *H01L 24/02* (2013.01); *H01L 24/06* (2013.01); *H01L 24/14* (2013.01); *H01L 24/13* (2013.01); *H01L 2224/02371* (2013.01); *H01L 2224/02372* (2013.01); *H01L 2224/02375* (2013.01); *H01L 2224/02377* (2013.01); *H01L 2224/02379* (2013.01); *H01L 2224/0401* (2013.01); *H01L 2224/05* (2013.01);

(Continued)

(58) Field of Classification Search
USPC ...................... 257/E23.021, E27.11, 59, 738
See application file for complete search history.

(56) References Cited

U.S. PATENT DOCUMENTS

| | | | | |
|---|---|---|---|---|
| 5,885,855 A | * | 3/1999 | Liang ...................... | H01L 23/50 257/E23.02 |
| 6,037,677 A | * | 3/2000 | Gottschall ......... | H01L 23/49838 257/E23.07 |

(Continued)

FOREIGN PATENT DOCUMENTS

| | | |
|---|---|---|
| JP | 2003017620 A | 1/2003 |
| JP | 2005150578 A | 6/2005 |

(Continued)

*Primary Examiner* — Tram H Nguyen
(74) *Attorney, Agent, or Firm* — Harness, Dickey & Pierce, P.L.C.

(57) ABSTRACT

Semiconductor devices with redistribution pads are disclosed. The semiconductor device includes a plurality of electric pads provided on a semiconductor substrate, and a plurality of redistribution pads electrically connected to the electric pads and an outer terminal. The plurality of redistribution pads includes a plurality of first redistribution pads constituting a transmission path for a first electrical signal and at least one second redistribution pad constituting a transmission path for a second electrical signal different from the first electrical signal. The first redistribution pads are arranged on the semiconductor substrate to form at least two rows, and the at least one second redistribution pad is disposed between the at least two rows of the first redistribution pads.

18 Claims, 24 Drawing Sheets

(52) U.S. Cl.
CPC .......... *H01L 2224/05553* (2013.01); *H01L 2224/05555* (2013.01); *H01L 2224/0616* (2013.01); *H01L 2224/06131* (2013.01); *H01L 2224/06135* (2013.01); *H01L 2224/06139* (2013.01); *H01L 2224/06151* (2013.01); *H01L 2224/06152* (2013.01); *H01L 2224/06155* (2013.01); *H01L 2224/06156* (2013.01); *H01L 2224/06159* (2013.01); *H01L 2224/06165* (2013.01); *H01L 2224/06169* (2013.01); *H01L 2224/06177* (2013.01); *H01L 2224/06181* (2013.01); *H01L 2224/131* (2013.01); *H01L 2224/13022* (2013.01); *H01L 2224/1403* (2013.01); *H01L 2224/14181* (2013.01); *H01L 2224/16227* (2013.01)

(56) References Cited

U.S. PATENT DOCUMENTS

| | | |
|---|---|---|
| 7,446,414 B2 | 11/2008 | Watanabe |
| 7,964,494 B2 | 6/2011 | Drexl et al. |
| 8,188,606 B2 | 5/2012 | Alvarado et al. |
| 8,242,610 B2 | 8/2012 | Yamaguchi et al. |
| 8,269,346 B2 | 9/2012 | Seta et al. |
| 8,569,886 B2 | 10/2013 | Tu et al. |
| 8,878,371 B2 | 11/2014 | Seta et al. |
| 8,912,660 B2 | 12/2014 | Kato et al. |
| 8,916,465 B2 | 12/2014 | Yu et al. |
| 2002/0093107 A1* | 7/2002 | Wu ............... H01L 23/3114 257/780 |
| 2005/0012225 A1 | 1/2005 | Choi et al. |
| 2009/0065924 A1* | 3/2009 | Kim ............... H01L 24/05 257/690 |
| 2010/0096754 A1* | 4/2010 | Lee ............... H01L 21/568 257/738 |
| 2014/0191394 A1 | 7/2014 | Lin et al. |
| 2015/0076698 A1 | 3/2015 | Lin et al. |
| 2015/0118841 A1 | 4/2015 | Matsuki |

FOREIGN PATENT DOCUMENTS

| | | |
|---|---|---|
| JP | 2010251687 A | 11/2010 |
| JP | 2015015505 A | 1/2015 |

\* cited by examiner

SEMICONDUCTOR DEVICES WITH REDISTRIBUTION PADS

CROSS-REFERENCE TO RELATED APPLICATIONS

This U.S. non-provisional patent application claims priority under 35 U.S.C. §119 to Korean Patent Application No. 10-2015-0131832, filed on Sep. 17, 2015, in the Korean Intellectual Property Office, the entire contents of which are hereby incorporated by reference.

BACKGROUND OF THE INVENTION

Example embodiments relate to a semiconductor device, and/or to semiconductor devices with redistribution pads.

With an increasing demand for high-performance high-density semiconductor devices, it may be advantageous to develop a semiconductor device or a semiconductor package capable of realizing a high signal transferring speed and a reduced pattern size. A redistribution technology may be considered an effective solution because this technology may allow a semiconductor device to have a reduced size and improved electric characteristics.

SUMMARY

Some example embodiments of the inventive concepts provide a semiconductor device with a reduced size.

Some example embodiments of the inventive concepts provide a semiconductor device with improved electrically characteristics.

Some example embodiments of the inventive concepts provide a semiconductor device, in which redistribution pads are more efficiently arranged.

In some example embodiments of the inventive concepts, a semiconductor device with redistribution pads may include at least two rows of input/output pads and power/ground pads arranged between the two rows of the input/output pads.

In some example embodiments of the inventive concepts, a redistribution structure between the electric pad and the redistribution pad may have a small length in order to allow the semiconductor device to have improved electric characteristics.

In some example embodiments of the inventive concepts, the pads may be disposed to have an improved arrangement, allowing for a reduction in the size of the semiconductor device, and for an efficient supply of electric power.

According to some example embodiments of the inventive concepts, a semiconductor device may include a plurality of electric pads provided on a semiconductor substrate, and a plurality of redistribution pads electrically connected to the electric pads and an outer terminal. The plurality of redistribution pads may include a plurality of first redistribution pads constituting a transmission path for a first electrical signal and at least one second redistribution pad constituting a transmission path for a second electrical signal different from the first electrical signal. The plurality of first redistribution pads may be arranged on the semiconductor substrate to form at least two rows, and the at least one second redistribution pad may be disposed on the semiconductor substrate and between the at least two rows of the first redistribution pads.

In some example embodiments, the semiconductor substrate may include at least one peripheral region extending to cross a center of the semiconductor substrate, and at least two cell regions spaced apart from each other by the peripheral region. The first and second redistribution pads may be arranged on the peripheral region and parallel to an extension direction of the peripheral region.

In some example embodiments, the electric pads may be provided on the peripheral region.

In some example embodiments, the semiconductor device may further include at least one auxiliary pad electrically connected to the second redistribution pad.

In some example embodiments, the auxiliary pad may be provided on the cell region.

In some example embodiments, the electric pads may be provided on the cell region.

In some example embodiments, some of the electric pads may be provided on the cell region, and others of the electric pads may be provided on the peripheral region.

In some example embodiments, the first electrical signal may include an input/output signal, and the second electrical signal may include at least one of a power signal and a ground signal.

In some example embodiments, the semiconductor substrate may include a plurality of cell regions occupying corner regions of the semiconductor substrate and a cross-shaped peripheral region separating the cell regions from each other. The first and second redistribution pads may be arranged on the peripheral region and parallel to a first direction.

In some example embodiments, the semiconductor substrate may include a plurality of cell regions occupying corner regions of the semiconductor substrate and a cross-shaped peripheral region separating the cell regions from each other. The first and second redistribution pads may be arranged on the peripheral region and in two orthogonal directions to form a cross-shaped arrangement.

In some example embodiments, the semiconductor substrate may include at least one peripheral region extending parallel to a side of the semiconductor substrate and occupying an edge region of the semiconductor substrate adjacent to the side and at least one cell region occupying the remaining region of the semiconductor substrate, other than the peripheral region. The first and second redistribution pads may be arranged on the peripheral region and in an extension direction of the peripheral region.

In some example embodiments, the semiconductor substrate may include a cell region occupying a center of the semiconductor substrate and a closed-shaped peripheral region extending along an edge of the semiconductor substrate to enclose the cell region, the closed-shaped peripheral region being, for example, a ring-shaped peripheral region. The first and second redistribution pads may be arranged on and along the peripheral region to form a closed-shaped arrangement, the closed-shaped arrangement being, for example, a ring-shaped arrangement.

In some example embodiments, the first electrical signal may include an input/output signal, and the second electrical signal may include at least one of a power signal and a ground signal.

In some example embodiments, the plurality of redistribution pads may further include at least one dummy pad provided on the semiconductor substrate and between the at least two rows of the first redistribution pads.

According to some example embodiments of the inventive concepts, a semiconductor device may include a plurality of electric pads provided on a semiconductor substrate, and a plurality of redistribution pads electrically connected to the plurality of electric pads and an outer terminal. The plurality of electric pads may include a plurality of first electric pads constituting a transmission path for a first electrical signal and a plurality of second electric pads constituting a transmission path for a second electrical signal differing from the first electrical signal. The plurality of redistribution pads may include a plurality of first redistribution pads electrically connected to the plurality of first electric pads and a plurality of second redistribution pads electrically connected to the plurality of second electric pads. The first redistribution pads may be arranged to form at least two rows, and the second redistribution pads may be disposed between the at least two rows of the first redistribution pads.

In some example embodiments, the first redistribution pads may be arranged on a center region of the semiconductor substrate and in a first direction crossing the center of the semiconductor substrate, and the second redistribution pads may be arranged on the center region of the semiconductor substrate in the first direction.

In some example embodiments, the first electric pads may be arranged on the center region of the semiconductor substrate to form at least two rows parallel to the first direction. The second electric pads may be arranged on the center region of the semiconductor substrate and in the first direction and may be disposed between the first electric pads.

In some example embodiments, the plurality of redistribution pads may further include a plurality of auxiliary pads electrically connected to the second redistribution pads.

In some example embodiments, the auxiliary pads may be arranged in the first direction.

In some example embodiments, the semiconductor substrate may include at least one cell region and at least one peripheral region, and the first and second redistribution pads may be provided on the peripheral region.

In some example embodiments, the first and second electric pads may be provided on the peripheral region.

In some example embodiments, the plurality of redistribution pads may further include a plurality of auxiliary pads electrically connected to the second redistribution pads, and the auxiliary pads form the transmission path for the second electrical signal.

In some example embodiments, the auxiliary pads may be provided on the cell region or the peripheral region.

According to some example embodiments of the inventive concepts, a semiconductor device may have a surface, on which a plurality of input/output pads and a plurality of power pads are provided. The input/output pads may be arranged on the surface of the semiconductor device to form a first row and a second row parallel to a first direction, and the power pads may be arranged on the surface of the semiconductor device to form a third row that may be between the first and second rows and parallel to the first direction.

In some example embodiments, the semiconductor device may include a cell region and a peripheral region, and at least one of the input/output and power pads may be provided on the peripheral region.

In some example embodiments, the peripheral region may extend from an end to an opposite end of the semiconductor device in the first direction in such a way that a center of the semiconductor device is positioned therein, and the cell region may include edge regions, spaced apart from each other by the center region in a second direction crossing the first direction, of the semiconductor device.

In some example embodiments, the semiconductor device may further include at least one auxiliary power pad electrically connected to each of the power pads. The power pad and the at least one auxiliary power pad electrically connected thereto form a single pad with substantially the same potential.

In some example embodiments, the semiconductor device may further include a plurality of electric pads. At least some of the input/output and power pads may serve as redistribution pads, to which the electric pads and outer terminals are electrically connected.

In some example embodiments, the semiconductor device may include a cell region and a peripheral region, and at least one of the electric pads may be provided on the peripheral region.

In some example embodiments, at least one of the input/output and power pads may have a size that is substantially equal to or larger than the size of the electric pad.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4A through 12A are plan views illustrating pad arrangements according to some example embodiments of the inventive concepts.

FIGS. 4B through 12B are plan views illustrating other examples of the pad arrangements of FIGS. 4A through 12A, respectively.

Figure 1A:
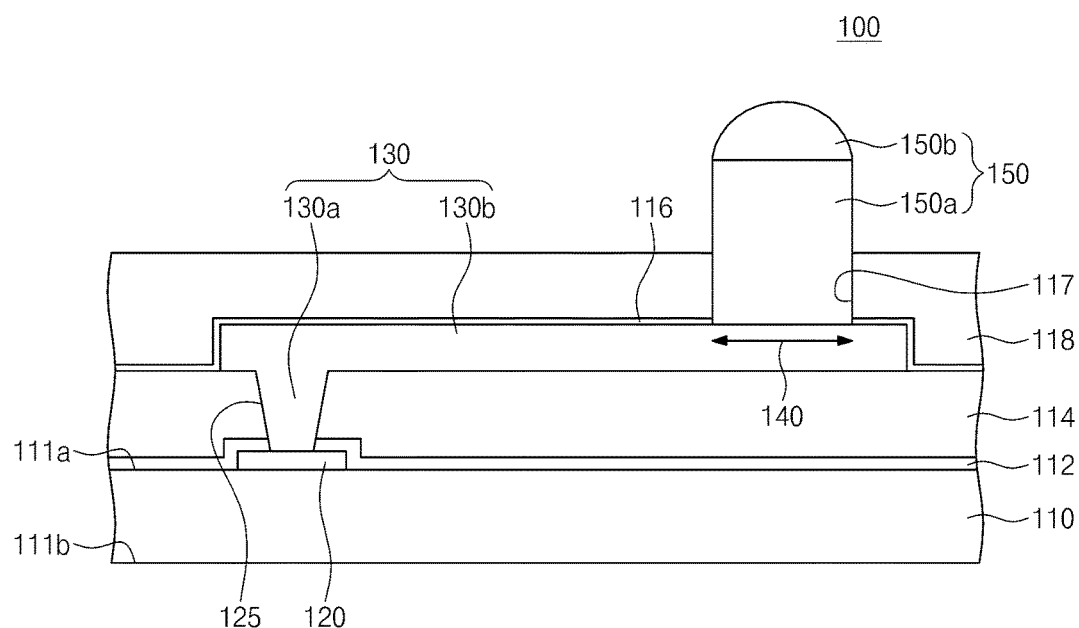
FIG. 1A is a sectional view illustrating a semiconductor device according to some example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by the example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The inventive concepts will now be described more fully hereinafter with reference to the accompanying drawings, in which example embodiments of the inventive concepts are shown. The inventive concepts and methods of achieving them will be apparent from the following example embodiments that will be described in more detail with reference to the accompanying drawings. The example embodiments of the inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on," "connected" or "coupled" to another element, it can be directly on, directly connected or directly coupled to the other element or intervening elements that may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present. Additionally, the embodiment in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Example embodiments of the inventive concepts explained and illustrated herein include their complementary counterparts. The same reference numerals or the same reference designators denote the same elements throughout the specification.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

[Semiconductor Device]

Figure 1B:
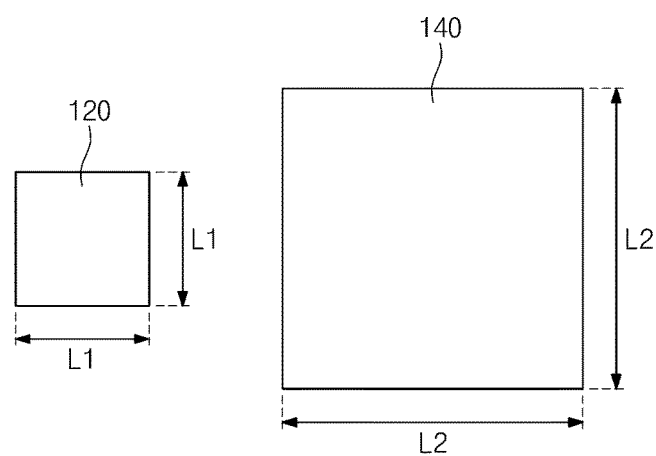
FIG. 1B is a plan view illustrating an electric pad and a redistribution pad, which are provided in a semiconductor device according to some example embodiments of the inventive concepts.
Figure 1C:
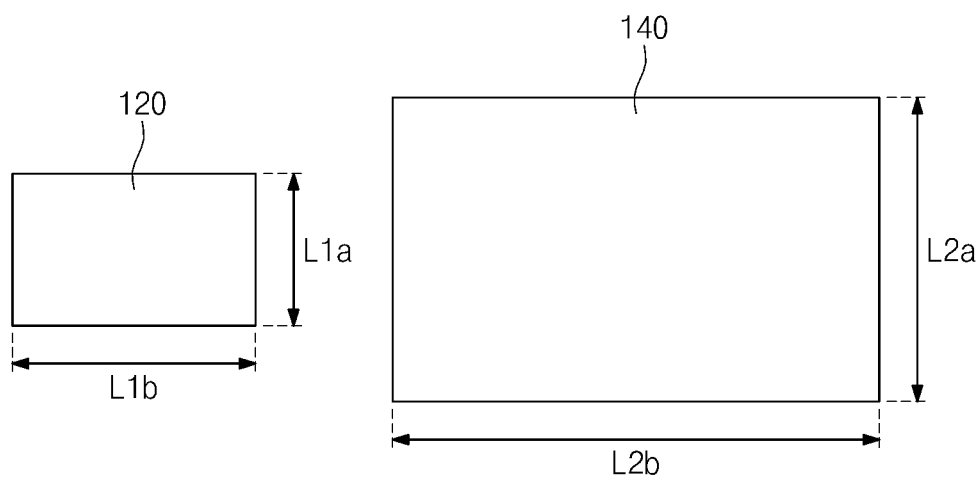
FIGS. 1C and 1D are plan views illustrating other examples of the electric and redistribution pads of FIG. 1B.
Figure 1D:
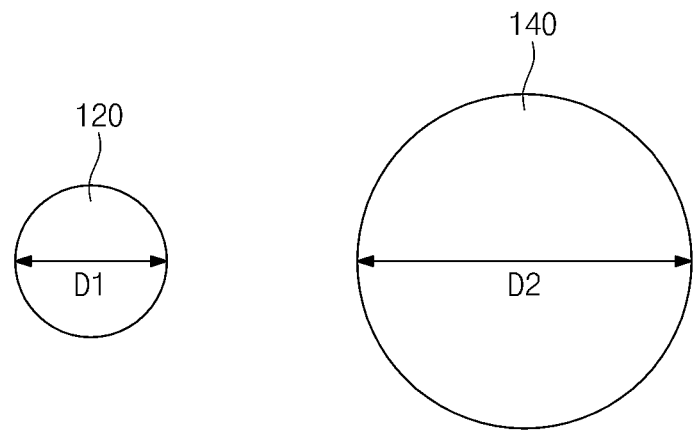
Figure 1E:
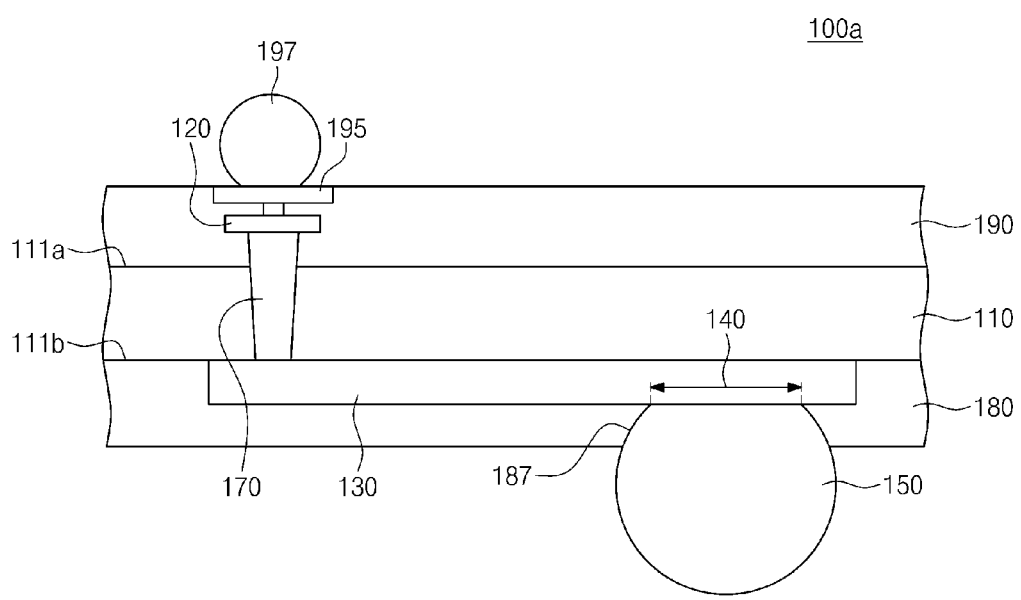
FIG. 1E is a sectional view illustrating another example of the semiconductor device of FIG. 1A.

FIG. 1A is a sectional view illustrating a semiconductor device according to some example embodiments of the inventive concepts. FIG. 1B is a plan view illustrating an electric pad and a redistribution pad, which are provided in a semiconductor device according to some example embodiments of the inventive concepts. FIGS. 1C and 1D are plan views illustrating other examples of the electric and redistribution pads of FIG. 1B. FIG. 1E is a sectional view illustrating another example of the semiconductor device of FIG. 1A.

Referring to FIG. 1A, a semiconductor device 100 may include a semiconductor substrate 110, a protection layer 112, an insulating layer 114, a redistribution structure 130, and a solder mask layer 118. The semiconductor substrate 110 may have a top surface 111a, on which one or more electric pads 120 are provided, and a bottom surface 111b. The protection layer 112 and the insulating layer 114 may be provided to cover, for example sequentially cover, the top surface 111a of the semiconductor substrate 110. The redistribution structure 130 may be provided on the insulating layer 114 and may be electrically connected to the electric pad 120. The solder mask layer 118 may be provided to cover the redistribution structure 130. The semiconductor device 100 may be mounted on, for example, a printed circuit board (PCB) in a flip-chip bonding manner, thereby constituting a semiconductor package.

The top surface 111a of the semiconductor substrate 110 may be an active surface, on which a circuit pattern electrically connected to the electric pad 120 is integrated, and the bottom surface 111b may be an inactive surface. The circuit pattern may include at least one of a memory circuit, a logic circuit, or a combination thereof. The electric pads 120 may be disposed on a center or edge region of the top surface 111a of the semiconductor substrate 110 to form one or more rows, as will be described below.

The redistribution structure 130 may include a redistribution pad 140, and the solder mask layer 118 may include an opening 117 selectively exposing the redistribution pad 140. The opening 117 may be filled with an outer terminal 150 formed of or including a conductive material. The outer terminal 150 may include a metal pillar 150a and a solder 150b, which are stacked, for example sequentially stacked, to form a bump. Alternatively, the outer terminal 150 may be provided in the form of a solder ball. The semiconductor device 100 may further include an insulating layer 116, which is provided to cover the redistribution structure 130.

The electric pad 120 may be exposed by an opening 125, which may be formed through a selective removal of the protection layer 112 and the insulating layer 114. The redistribution structure 130 may include a vertical pattern 130a, which fills the opening 125 and is coupled to the electric pad 120, and a horizontal pattern 130b horizontally extending from the vertical pattern 130a. The horizontal pattern 130b may be provided to have a linear, curved, or bent shape. As described above, a portion of the horizontal pattern 130b may be used as the redistribution pad 140, to which the outer terminal 150 is coupled.

The electric pad 120 may be provided to have a size or area that is equal to or smaller than the size or area of the redistribution pad 140. For example, as shown in FIG. 1B, in the case where the electric pad 120 and the redistribution pad 140 have square shapes in a plan view, a length L2 of each side of the redistribution pad 140 may be at least about one or three times a length L1 of each side of the electric pad 120.

Alternatively, in the case where, as shown in FIG. 1C, the electric pad 120 and the redistribution pad 140 have substantially rectangular shapes in a plan view, a length L2a of a short side of the redistribution pad 140 may be at least about one to three times a length L1a of a short side of the electric pad 120. In the case where as shown in FIG. 1D the electric pad 120 and the redistribution pad 140 have circular shapes in a plan view, a diameter D2 of the redistribution pad 140 may be at least about one to three times a diameter D1 of the electric pad 120. The shapes of the electric pad 120 and the redistribution pad 140 are not be limited to the above examples of substantially square, substantially rectangle, or substantially circle and may be variously changed.

Referring to FIG. 1E, as another example of the inventive concepts, a semiconductor device 100a may include an interlayered insulating layer 190 covering the top surface 111a of the semiconductor substrate 110, a through electrode 170 passing through at least the semiconductor substrate 110, the redistribution structure 130 being electrically connected to the through electrode 170, and a lower protection layer 180 covering the redistribution structure 130. In example embodiments, the through electrode 170 may be electrically connected to the electric pad 120, and in other example embodiments, the through electrode 170 may be vertically extended, or extended in a direction substantially perpendicular to the top surface 111a of the semiconductor substrate 110, to penetrate at least a portion of the interlayered insulating layer 190.

The top surface 111a of the semiconductor substrate 110 may be an active surface, on which a circuit pattern electrically connected to the electric pad 120 is integrated, and the bottom surface 111b may be an inactive surface, on which the redistribution structure 130 is provided. The electric pad 120 may be electrically connected to a metal line 195, and moreover, the electric pad 120 may be electrically connected to an outer terminal 197 coupled to the metal line 195. The lower protection layer 180 may include an opening 187, and a portion of the redistribution structure 130 may be selectively exposed by the opening 187 as the redistribution pad 140. The outer terminal 150 (e.g., a solder ball) may be coupled to the redistribution pad 140. An insulating layer may be further provided between the bottom surface 111b of the semiconductor substrate 110 and the redistribution structure 130.

There may be many ways to arrange the redistribution and electric pads 140 and 120 of the semiconductor device 100, as will be described below. The redistribution pad 140 and the electric pad 120 of the semiconductor device 100a may be arranged in the same or a similar manner as pad arrangements of the semiconductor device 100 that will be described below.

[Arrangement of Electric and Redistribution Pads]

Figure 2A:
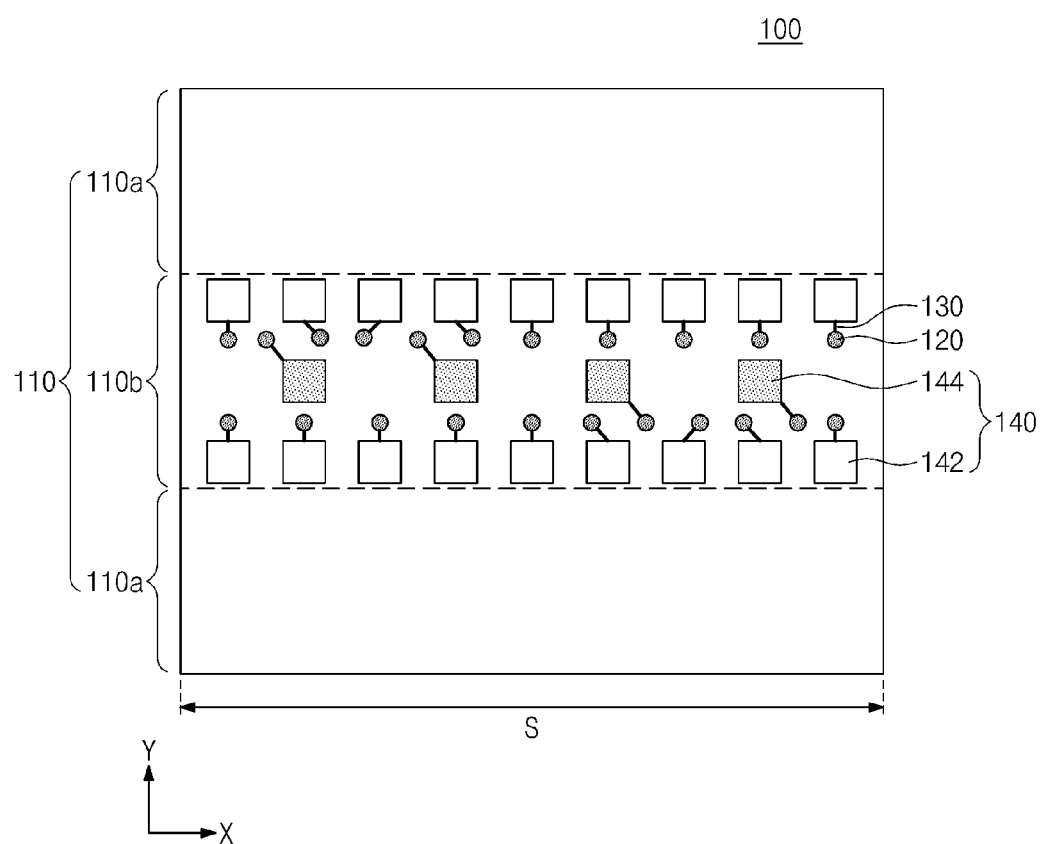
FIG. 2A is a plan view illustrating a pad arrangement according to some example embodiments of the inventive concepts.
Figure 2B:
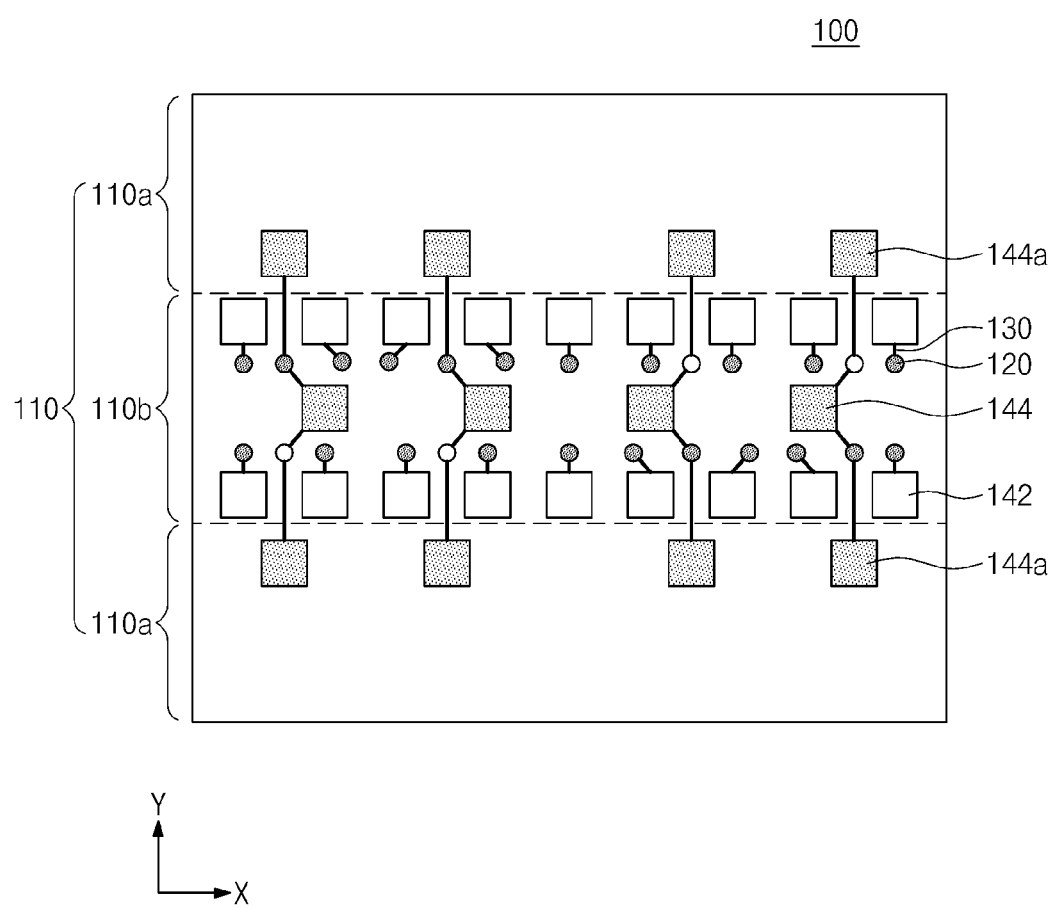
FIG. 2B is a plan view illustrating another example of the pad arrangement of FIG. 2A.
Figure 3:
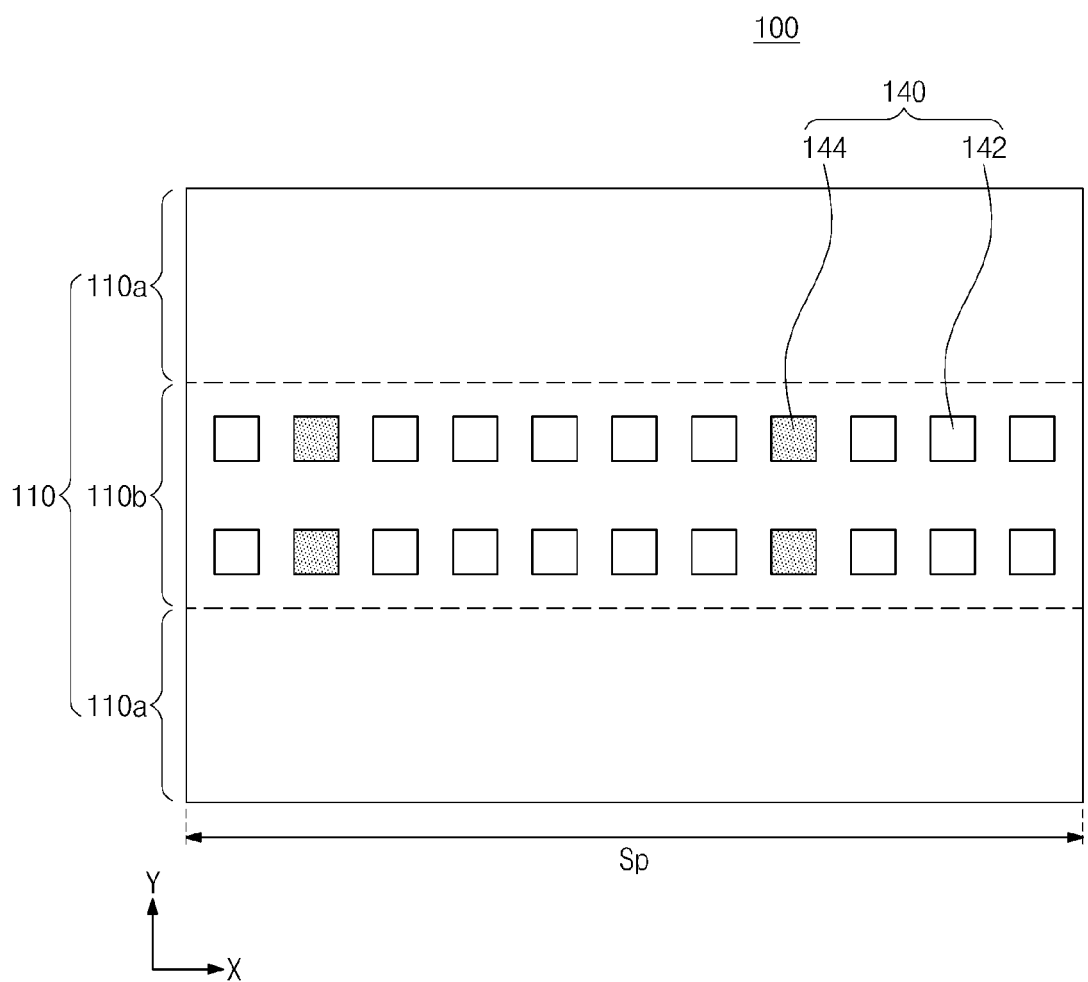
FIG. 3 is a plan view illustrating a pad arrangement of a semiconductor device according to a comparative example.

FIG. 2A is a plan view illustrating a pad arrangement according to some example embodiments of the inventive concepts. FIG. 2B is a plan view illustrating another example of the pad arrangement of FIG. 2A. FIG. 3 is a plan view illustrating a pad arrangement of a semiconductor device according to a comparative example.

Referring to FIG. 2A, the semiconductor device 100 may include at least one first region 110a and at least one second region 110b. The first region 110a may refer to a cell region of the semiconductor substrate 110, on which a cell array is provided, and the second region 110b may refer to a peripheral region of the semiconductor substrate 110, on which a peripheral circuit is provided.

In some example embodiments, a center region of the semiconductor device 100 may correspond to the second region 110b extending in a first direction X, and the remaining portions of the semiconductor device 100 may correspond to a plurality of first regions 110a, which are spaced apart from each other in a second direction Y by the second region 110b. In example embodiments, the first region 110a may refer to a region, on which the redistribution pads 140 are not provided, and the second region 110b may refer to another region provided with the redistribution pads 140.

The redistribution pads 140 may be provided on the second region 110b. In other words, the semiconductor device 100 may have a center pad structure. The redistribution pads 140 may include a plurality of input/output pads 142, to which input/output signals for operating the semiconductor device 100 are applied, and one or more power pads 144, to which at least one of power and ground signals are applied. In example embodiments, at least one of the redistribution pads 140 may be provided on at least one of the first regions 110a.

The input/output pads 142 may be arranged in at least two rows parallel to the first direction X. The power pads 144 may be arranged in the first direction X and may be provided between the at least two rows of the input/output pads 142. For example, the power pads 144 may be arranged in a single row parallel to the first direction X.

For example, the redistribution pads 140 may be arranged on the center region of the semiconductor device 100 and in at least three rows parallel to the first direction X. The input/output pads 142 may be arranged in two rows parallel to the first direction X, and the power pads 144 may be arranged between the two rows of the input/output pads 142 and in a row parallel to the first direction X. The power pads 144 and the input/output pads 142 may be aligned along the second direction; for example, each or at least one of the power pads 144 may be disposed to have the same x coordinate as a pair of the input/output pads 142 arranged in the second direction Y.

In the semiconductor device 100, the input/output pads 142 and the power pads 144 may be provided on the top surface 111a (e.g., the active surface) of the semiconductor substrate 110, as shown in FIG. 1A. In the semiconductor device 100a, the input/output pads 142 and the power pads 144 may be provided on the bottom surface 111b (e.g., the inactive surface) of the semiconductor substrate 110, as shown in FIG. 1E.

In example embodiments, the redistribution pads 140 may be arranged on the center region of the semiconductor device 100 and in two rows parallel to the first direction X, as shown in the comparative example illustrated FIG. 3. At least one of the power pads 144 may be disposed between the input/output pads 142 on the same row. In this case, a length Sp of a region occupied by the power pads 144 and the input/output pads 142 may be longer than the corresponding length in the semiconductor devices illustrated in FIGS. 2A and 2B.

According to some example embodiments of the inventive concepts, as shown in FIG. 2A, since the power pads 144 are provided between the at least two rows of the input/output pads 142, the semiconductor device 100 may have a reduced length S in the first direction X. The reduction of the length S may make it possible to decrease a size or area of the semiconductor device 100. Furthermore, since, as described previously with reference to FIGS. 1B through 1D, the electric pad 120 is provided to have a size smaller than the size of the redistribution pad 140, it is possible to reduce a size of the semiconductor device 100.

Referring back to FIG. 2A, the electric pads 120 may be disposed in a region of the semiconductor device 100 corresponding to the second region 110b. For example, since the redistribution pads 140 and the electric pads 120 are disposed on the second region 110b, it is possible to reduce a length of the redistribution structure 130 between the redistribution pad 140 and the electric pad 120. The reduction in length of the redistribution structure 130 may lead to a reduction in electric resistance or inductance thereof, and thus, it may be possible to reduce noise signals during operation of the semiconductor device 100. The electric pads 120 may be disposed between the input/output pads 142 and the power pads 144 to form at least one row parallel to the first direction X.

Referring to FIG. 2B, the semiconductor device 100 may further include at least one auxiliary power pad 144a electrically connected to the power pad 144. As an example, a pair of the auxiliary power pads 144a may be electrically connected to each or at least one of the power pads 144. The auxiliary power pads 144a may be provided on, for example, the first region 110a. As another example, the auxiliary power pads 144a may be provided on the second region. The auxiliary power pads 144a may be arranged to form at least one row parallel to the first direction X. The auxiliary power pads 144a and the power pad 144 may also be disposed to form a zigzag arrangement, or an alternating configuration, in the second direction Y.

The power pad 144 may be electrically connected to the at least one auxiliary power pad 144a, thereby serving as a single pad with substantially the same potential. By applying a power signal through the single pad structure including a plurality of power pads 144 and 144a, it may be possible to efficiently supply electric power to the semiconductor device 100.

[Arrangement of Electric and Redistribution Pads]

FIGS. 4A through 12A are plan views illustrating pad arrangements according to some example embodiments of the inventive concepts. FIGS. 4B through 12B are plan views illustrating other examples of the pad arrangements of FIGS. 4A through 12A, respectively. For concise description, an element previously described with reference to FIG.

2A or 2B may be identified by a similar or identical reference number without repeating an overlapping description thereof.

Figure 4A:
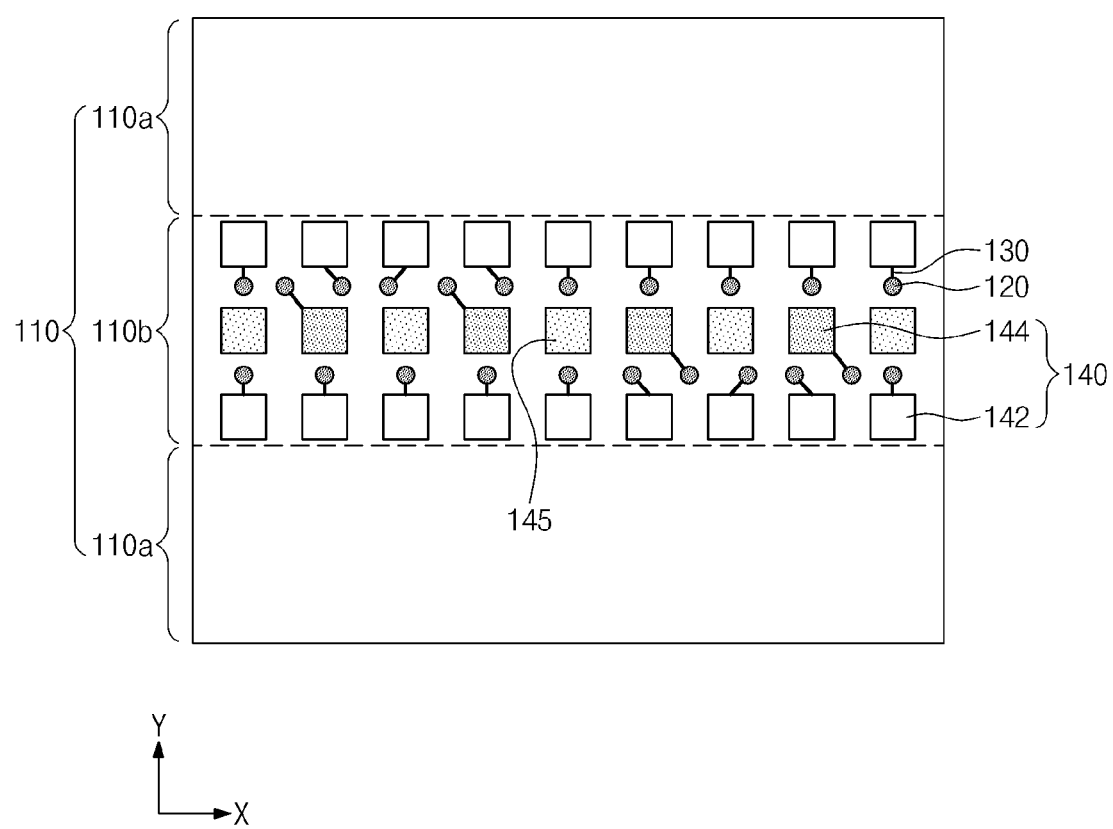
Figure 4B:
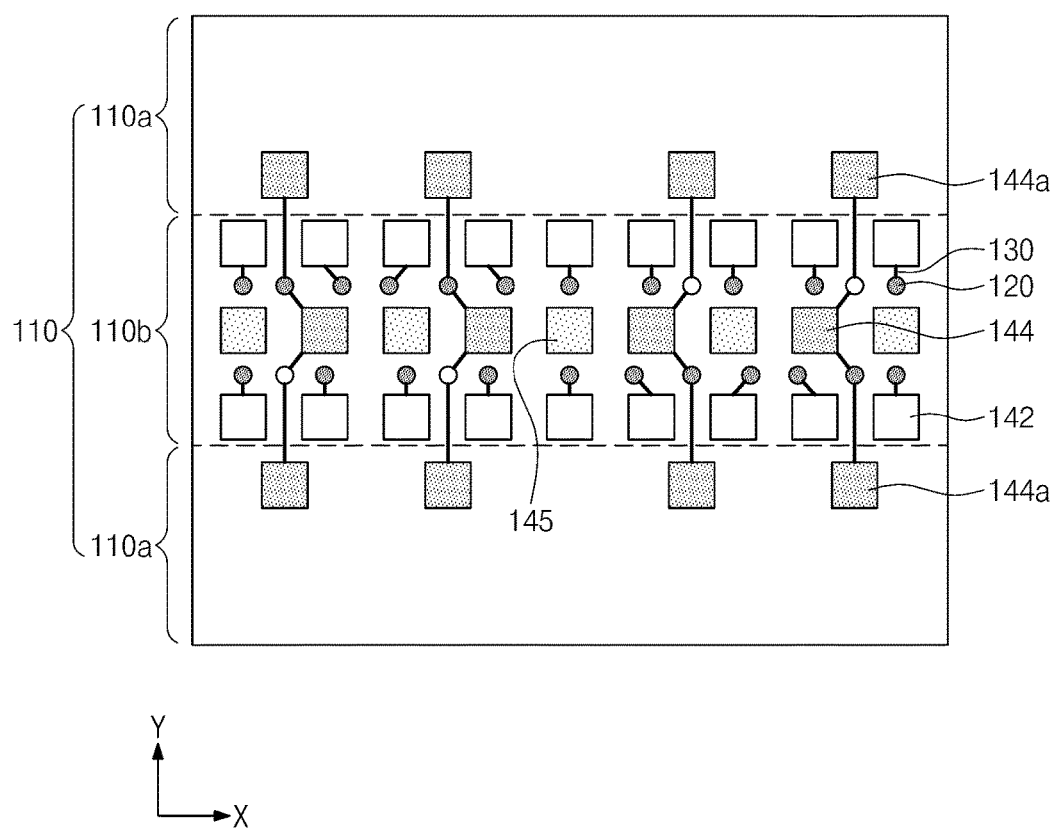

Referring to FIG. 4A, the semiconductor device 100 may further include at least one dummy pad 145. For example, one or a plurality of dummy pads 145 may be provided to form at least one row, along with the power pads 144. The dummy pads 145 may be disposed to form at least one row parallel to the first direction X, and each of the dummy pads 145 may be disposed between a corresponding pair of the power pads 144. As shown in FIG. 4B, the semiconductor device 100 may further include at least one auxiliary power pad 144a. Each of the auxiliary power pads 144a may be electrically connected to one of the power pads 144. This may make it possible to more efficiently supply electric power to the semiconductor device 100. In example embodiments of the inventive concepts, a semiconductor device may be configured to include the at least one dummy pad 145.

Figure 5A:
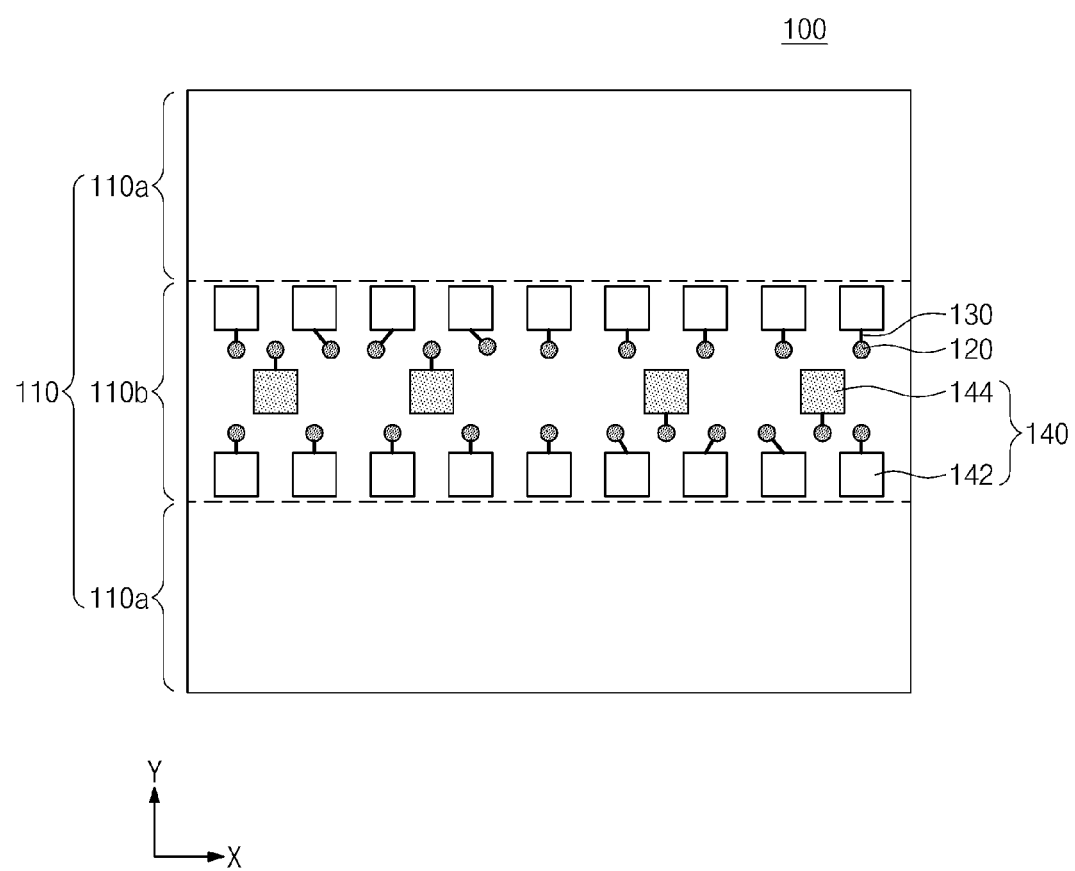
Figure 5B:
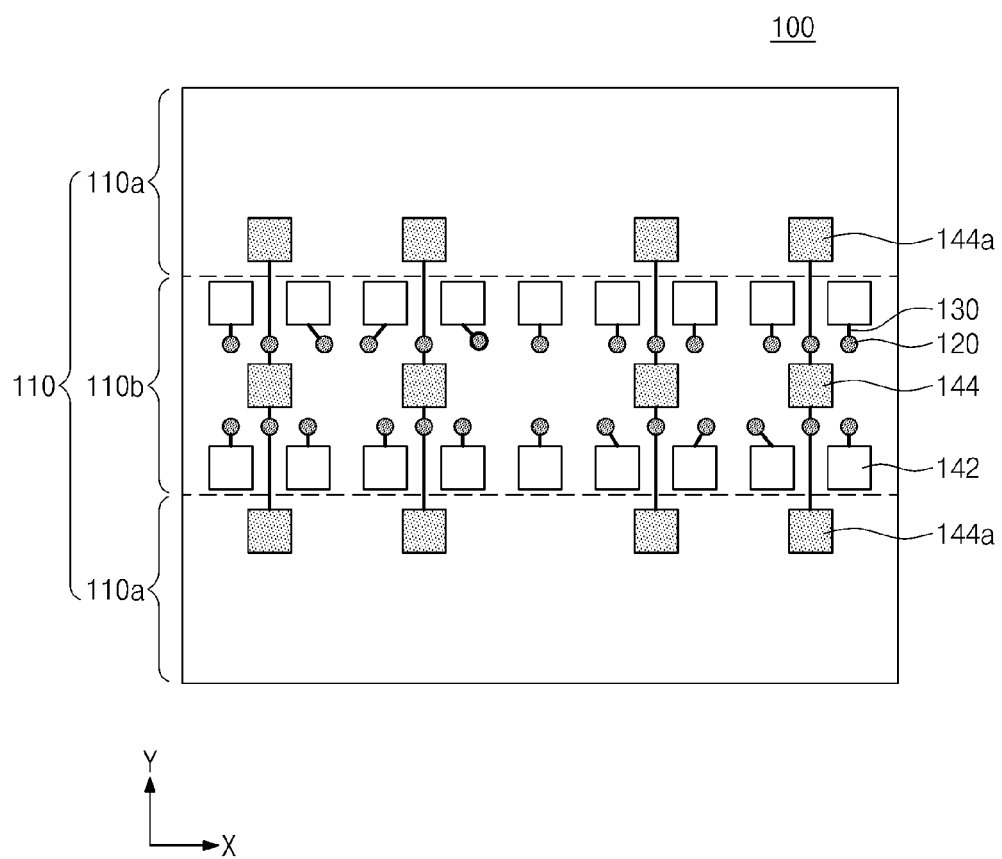

Referring to FIG. 5A, the power pad 144 and the input/output pad 142 may be disposed to form a zigzag arrangement or an alternating configuration in the second direction Y. As shown in FIG. 5B, the semiconductor device 100 may further include at least one auxiliary power pad 144a electrically connected to the power pad 144. The auxiliary power pads 144a may be provided on the first region 110a. The auxiliary power pads 144a and the power pad 144 may be disposed to form at least one row parallel to the second direction Y.

Figure 6A:
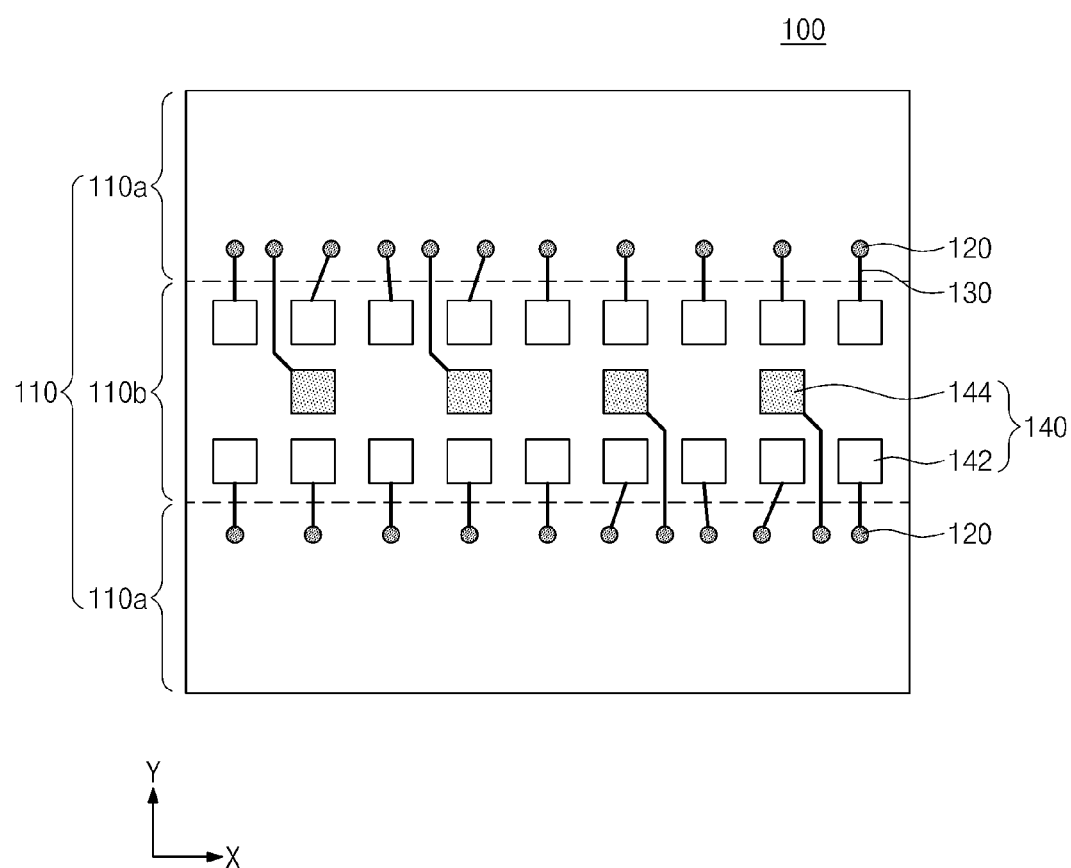
Figure 6B:
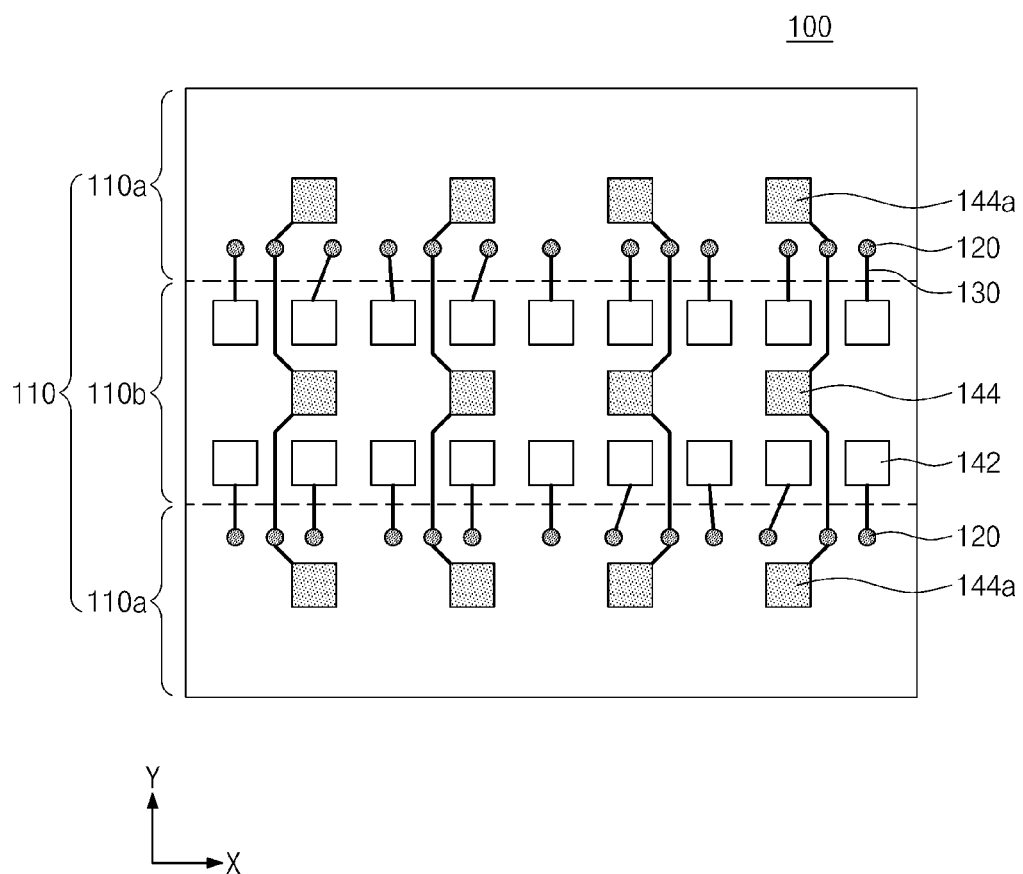

Referring to FIG. 6A, the electric pads 120 may be provided on the first region 110a. For example, the electric pads 120 electrically connected to the power pad 144 and the input/output pad 142 may be provided on the first region 110a. As shown in FIG. 6B, the auxiliary power pads 144a, along with the electric pads 120, may be provided on the first region 110a.

Figure 7A:
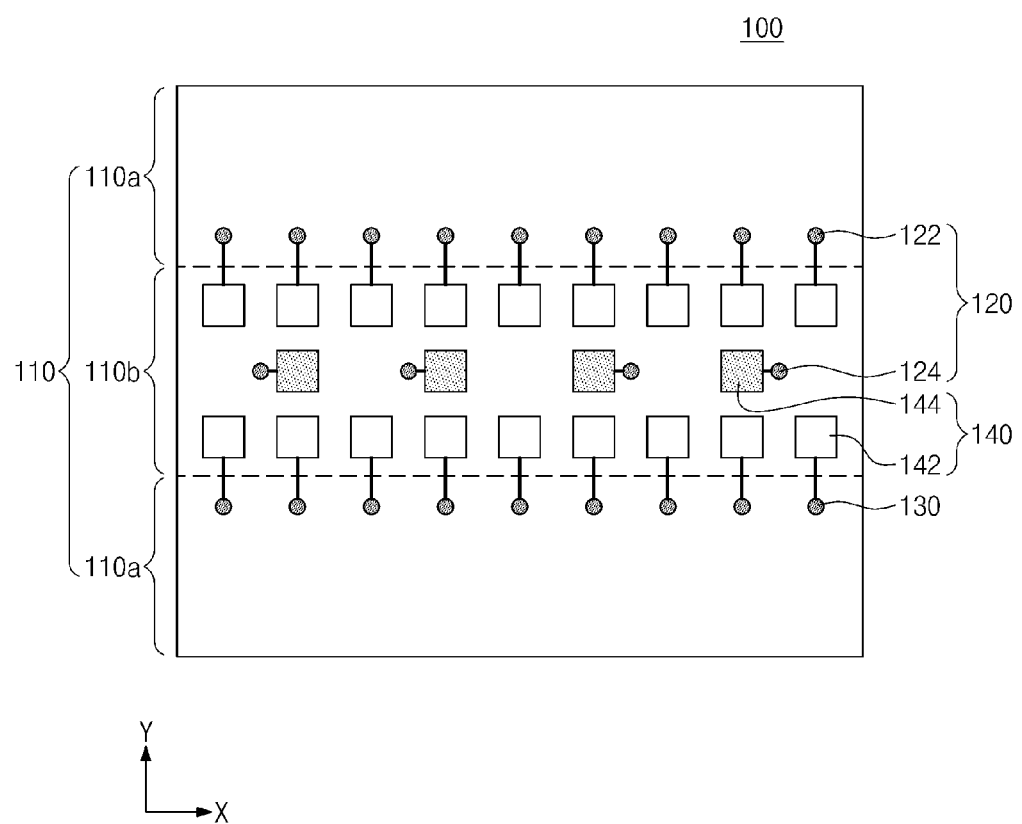
Figure 7B:
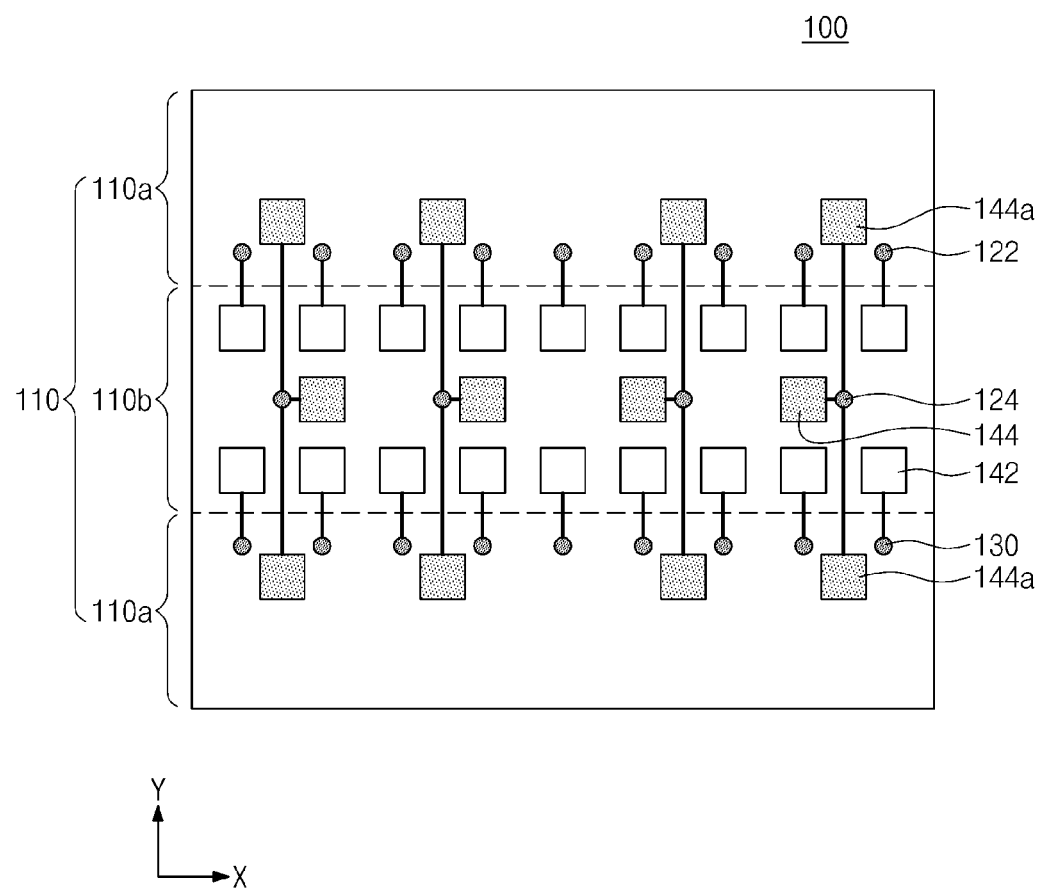

Referring to FIG. 7A, some of the electric pads 120 may be provided on the first region 110a, and other electric pads 120 may be provided on the second region 110b. As an example, first electric pads 122 electrically connected to the input/output pads 142 may be provided on the first region 110a, and second electric pads 124 electrically connected to the power pads 144 may be provided on the second region 110b. As shown in FIG. 7B, the auxiliary power pad 144a may be electrically connected to the power pad 144 through the second electric pads 124 provided on the second region 110b.

Figure 8A:
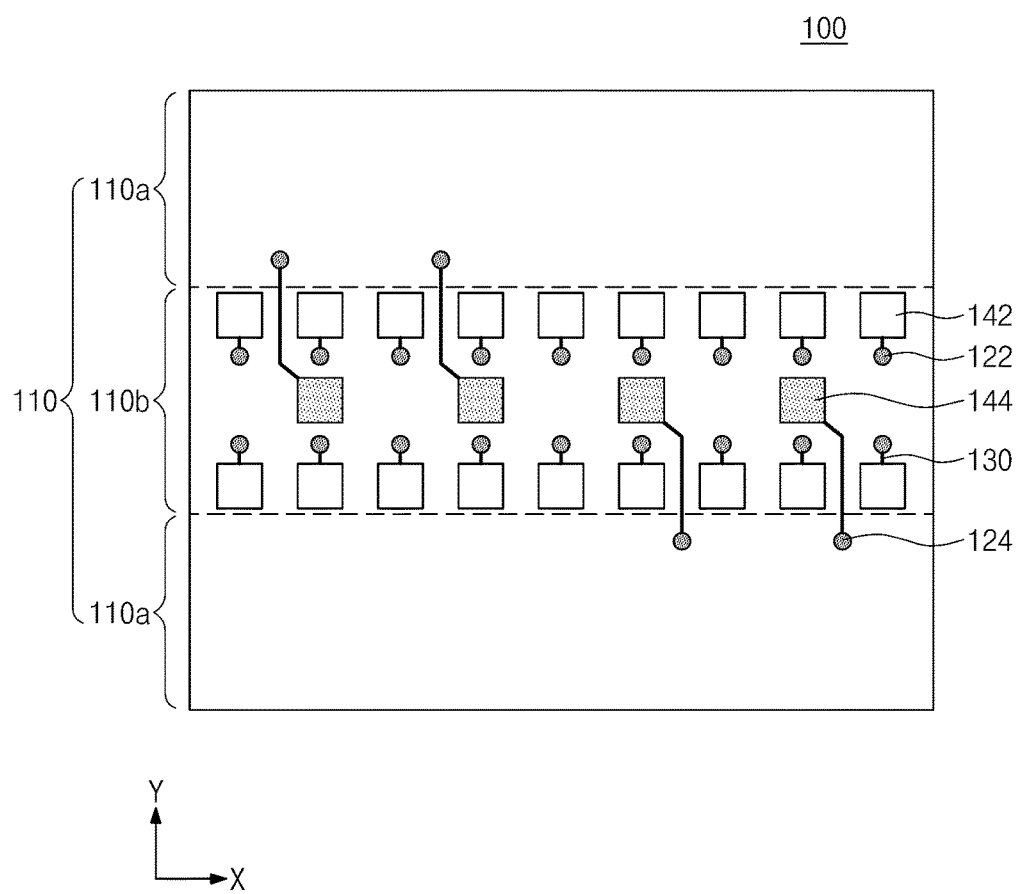
Figure 8B:
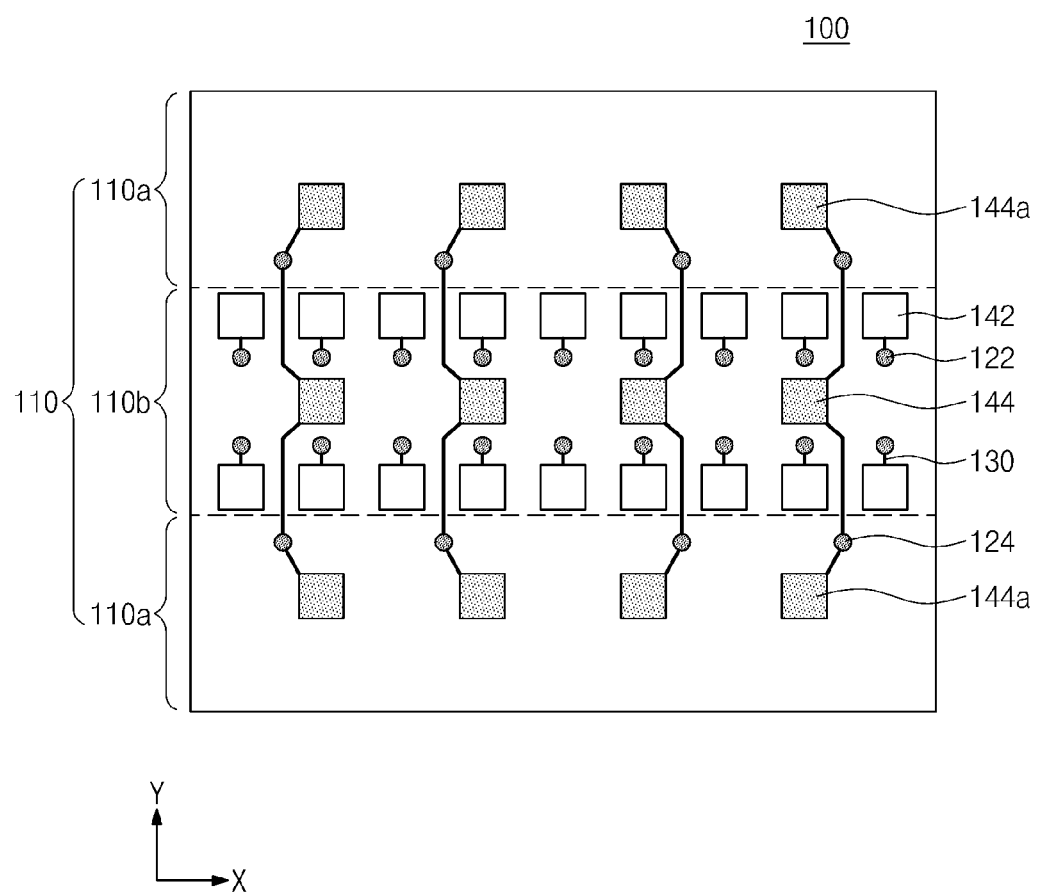

Referring to FIG. 8A, the first electric pads 122 electrically connected to the input/output pads 142 may be provided on the second region 110b, and the second electric pads 124 electrically connected to the power pads 144 may be provided on the first region 110a. As shown in FIG. 8B, the auxiliary power pad 144a may be electrically connected to the power pad 144 through the second electric pads 124 provided on the first region 110a.

Figure 9A:
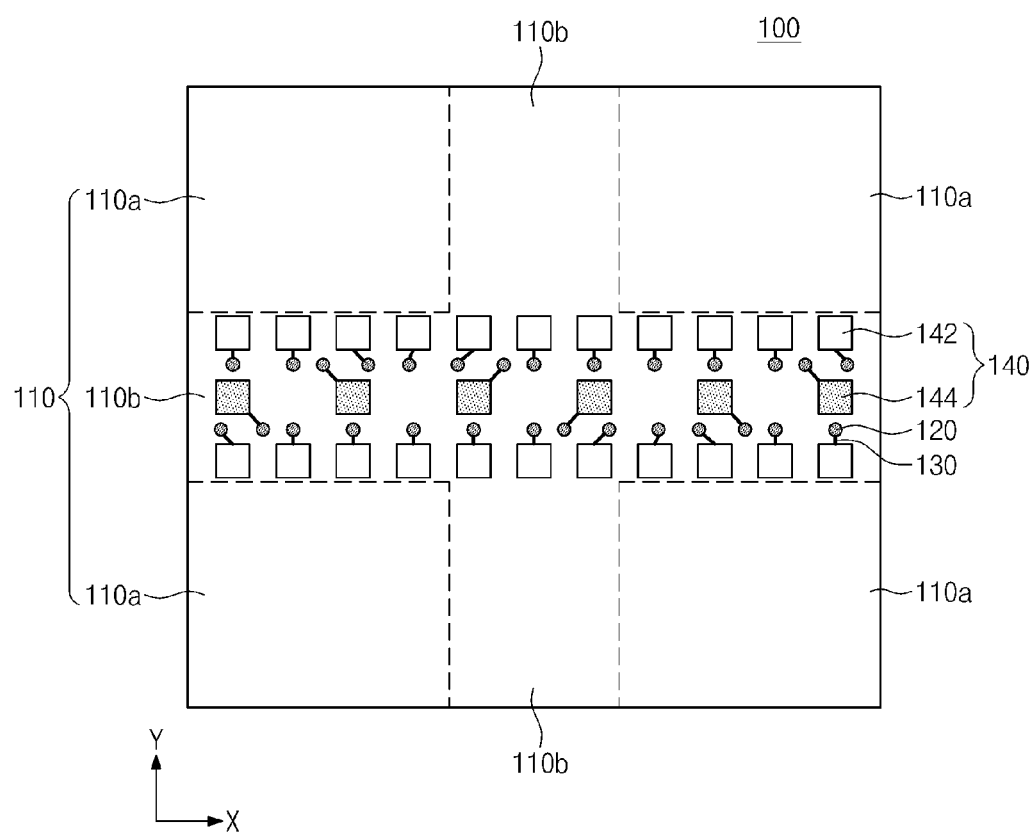
Figure 9B:
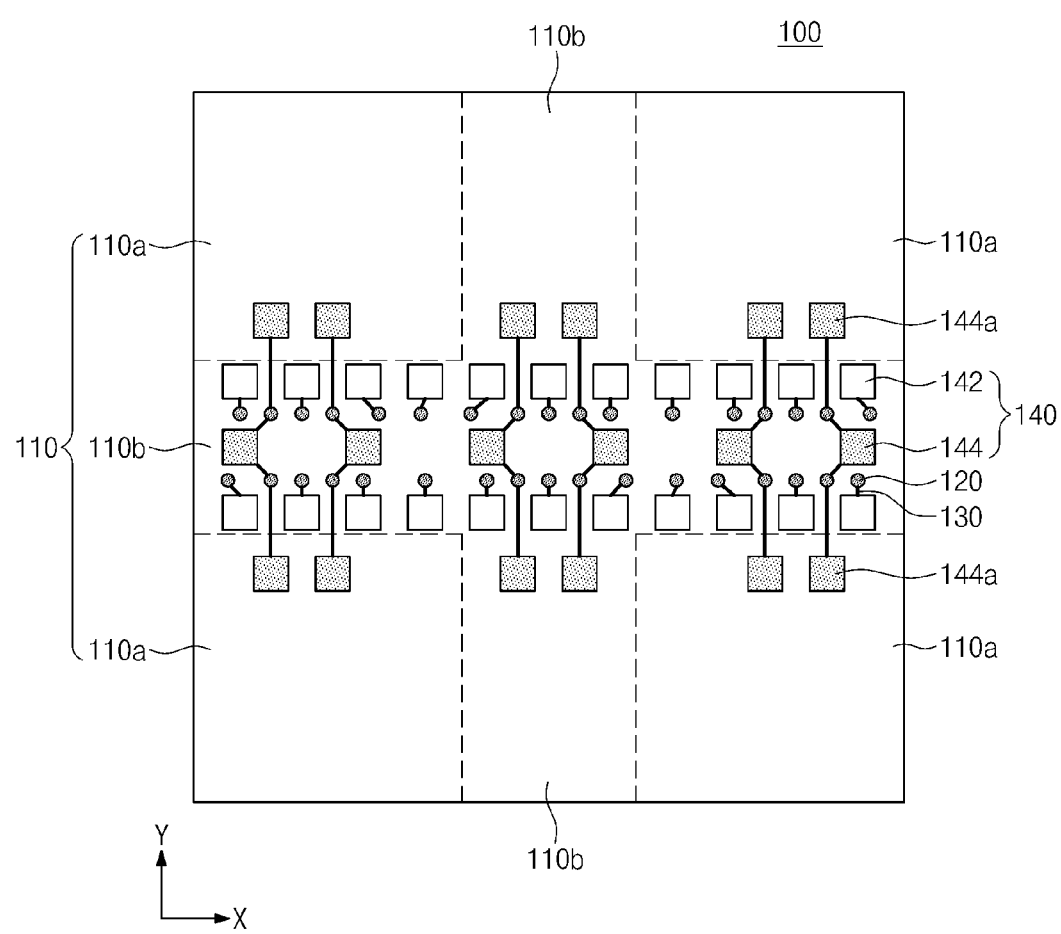

Referring to FIG. 9A, the semiconductor device 100 may include a plurality of first regions 110a occupying corners of the semiconductor device 100 and a second region 110b separating the first regions 110a from each other. For example, the second region 110b may be a cross-shaped region. The redistribution pads 140 may be provided on the second region 110b to form at least three rows parallel to a specific direction (e.g., the first direction X). The electric pads 120, along with the redistribution pads 140, may be provided on the second region 110b. As shown in FIG. 9B, in the case where the auxiliary power pads 144a are provided, some of the auxiliary power pads 144a may be provided on the first regions 110a and other auxiliary power pads 144a may be provided on the second region 110b. Substantially all of the electric pads 120 may be provided on the second region 110b. Alternatively, substantially all of the electric pads 120 may be provided on the first region 110a, as shown in FIG. 6A. In example embodiments, some of the electric pads 120 may be provided on the first region 110a, and other electric pads 120 may be provided on the second region 110b, as shown in FIG. 7A or FIG. 8A.

Figure 10A:
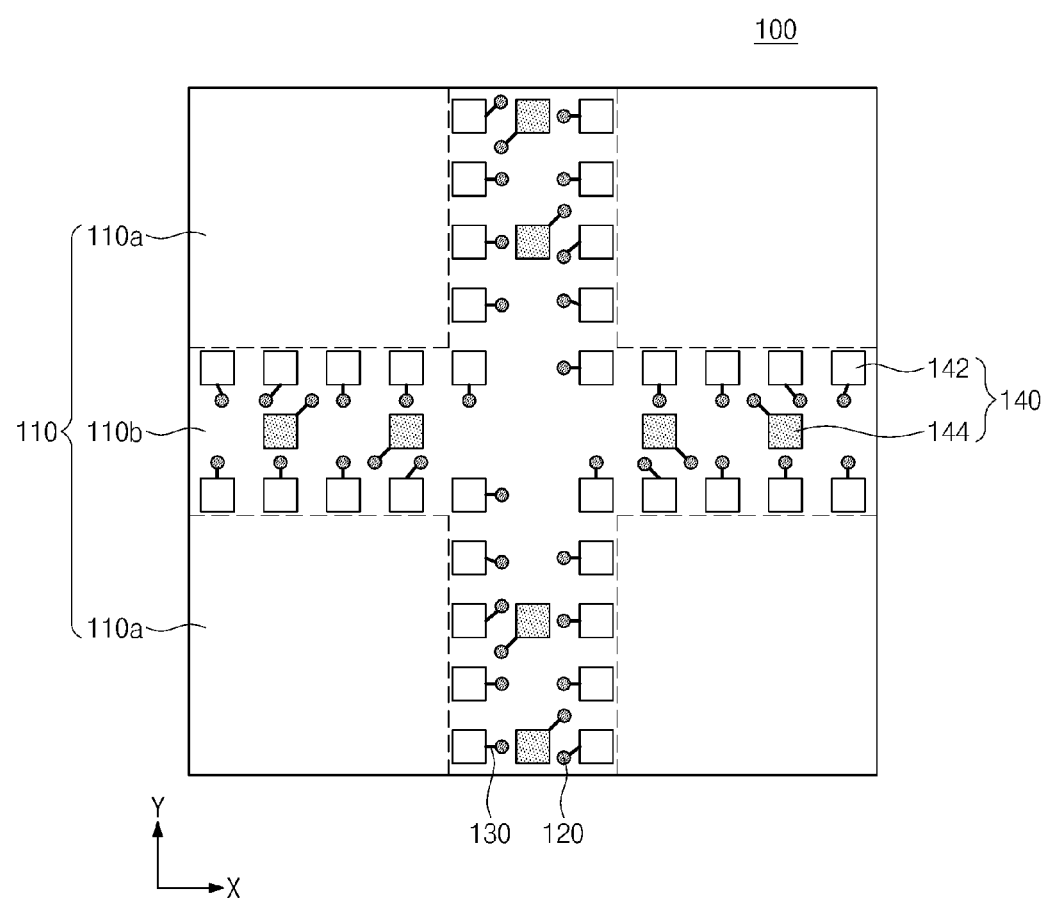
Figure 10B:
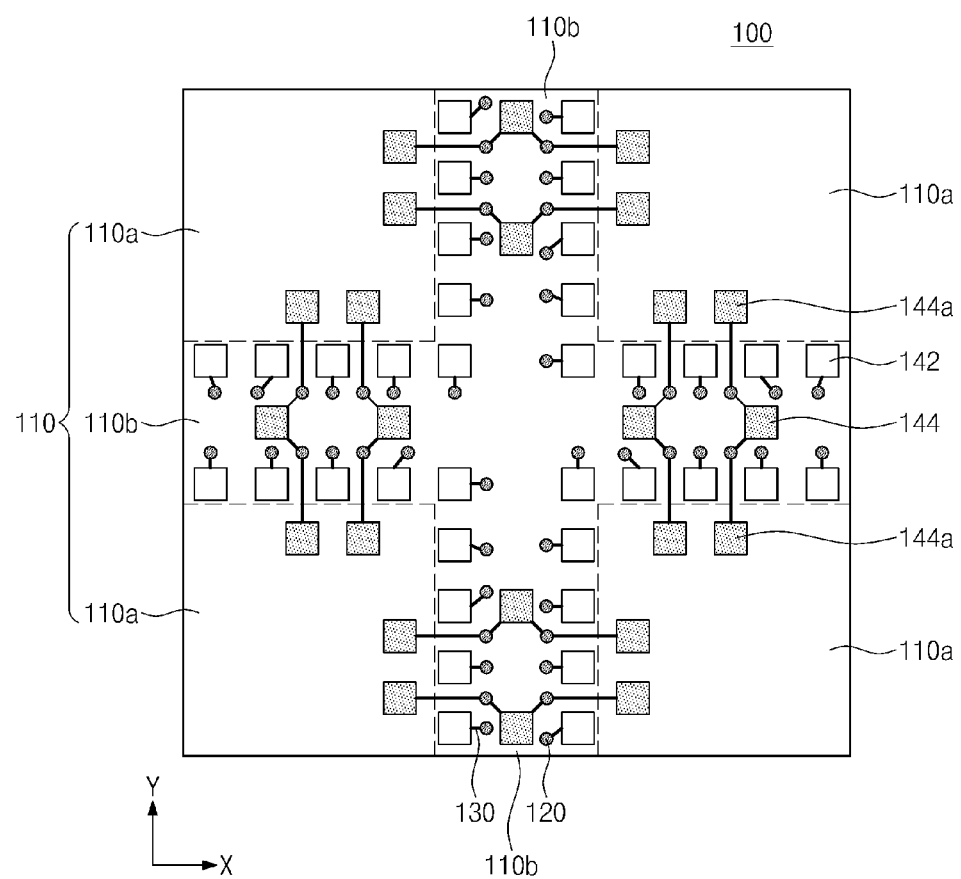

Referring to FIG. 10A, the redistribution pads 140 may be disposed on the cross-shaped second region 110b and may be disposed in both the first direction X and the second direction Y, thus forming a cross-shaped arrangement. As shown in FIG. 10B, in the case where the auxiliary power pads 144a are further provided, some of the auxiliary power pads 144a may be provided on the first regions 110a and other auxiliary power pads 144a may be provided on the second region 110b. Substantially all of the electric pads 120 may be provided on the second region 110b, as shown in FIG. 6A, but in certain embodiments, some of the electric pads 120 may be provided on the first region 110a and other electric pads 120 may be provided on the second region 110b, as shown in FIG. 7A or FIG. 8A.

Figure 11A:
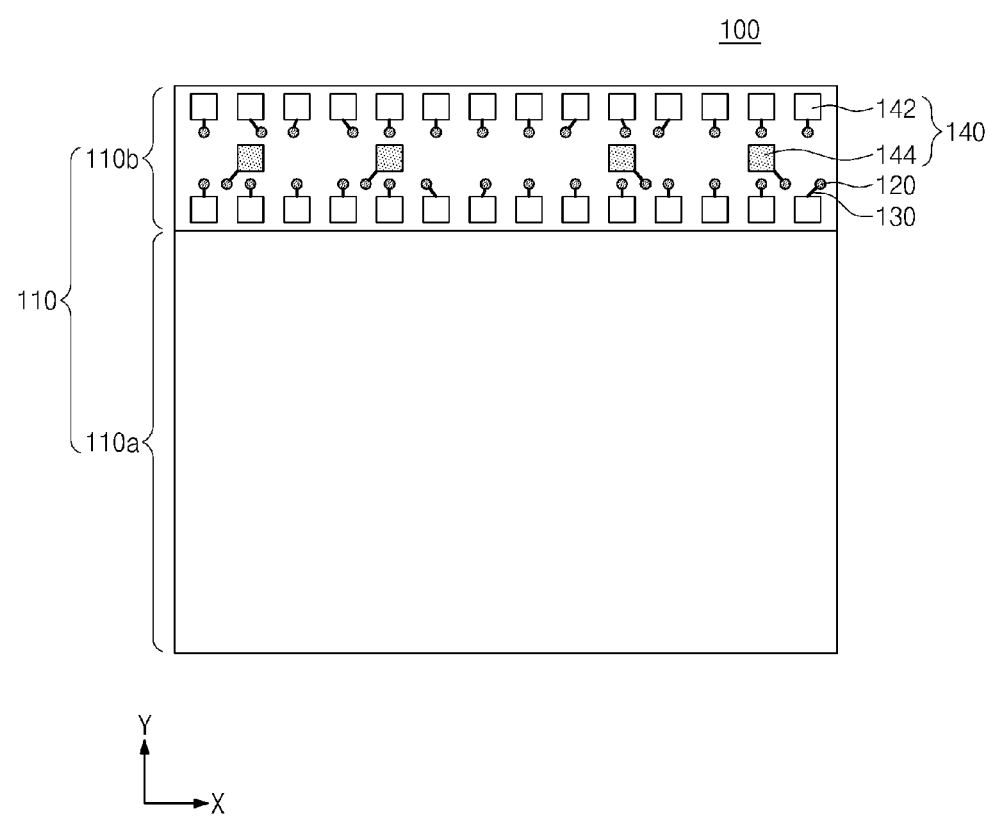
Figure 11B:
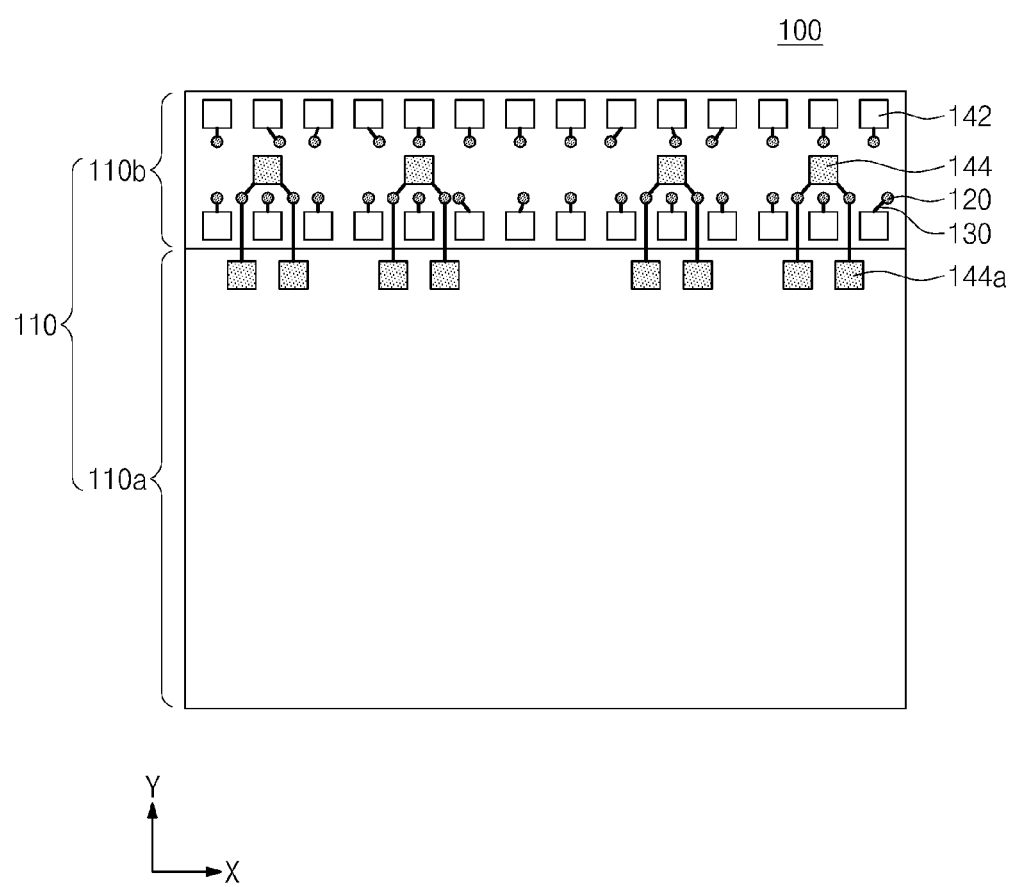

Referring to FIG. 11A, the semiconductor device 100 may include the first region 110a, which occupies a partial area of the semiconductor device 100, and the second region 110b, which occupies the remaining area of the semiconductor device 100. For example, the second region 110b may be adjacent to a side of the semiconductor device 100 and may extend in an extension direction (e.g., the first direction X) of that side. The redistribution pads 140 may be provided on the second region 110b and may be arranged to form at least three rows parallel to the first direction X. As shown in FIG. 11B, in the case where the auxiliary power pads 144a are further provided, the auxiliary power pads 144a may be provided on the first region 110a. The electric pads 120, along with the redistribution pads 140, may be provided on the second region 110b. In example embodiments, substantially all of the electric pads 120 may be provided on the first region 110a, as shown in FIG. 6A. Alternatively, as shown in FIG. 7A or FIG. 8A, some of the electric pads 120 may be provided on the first region 110a, and other electric pads 120 may be provided on the second region 110b.

Figure 12A:
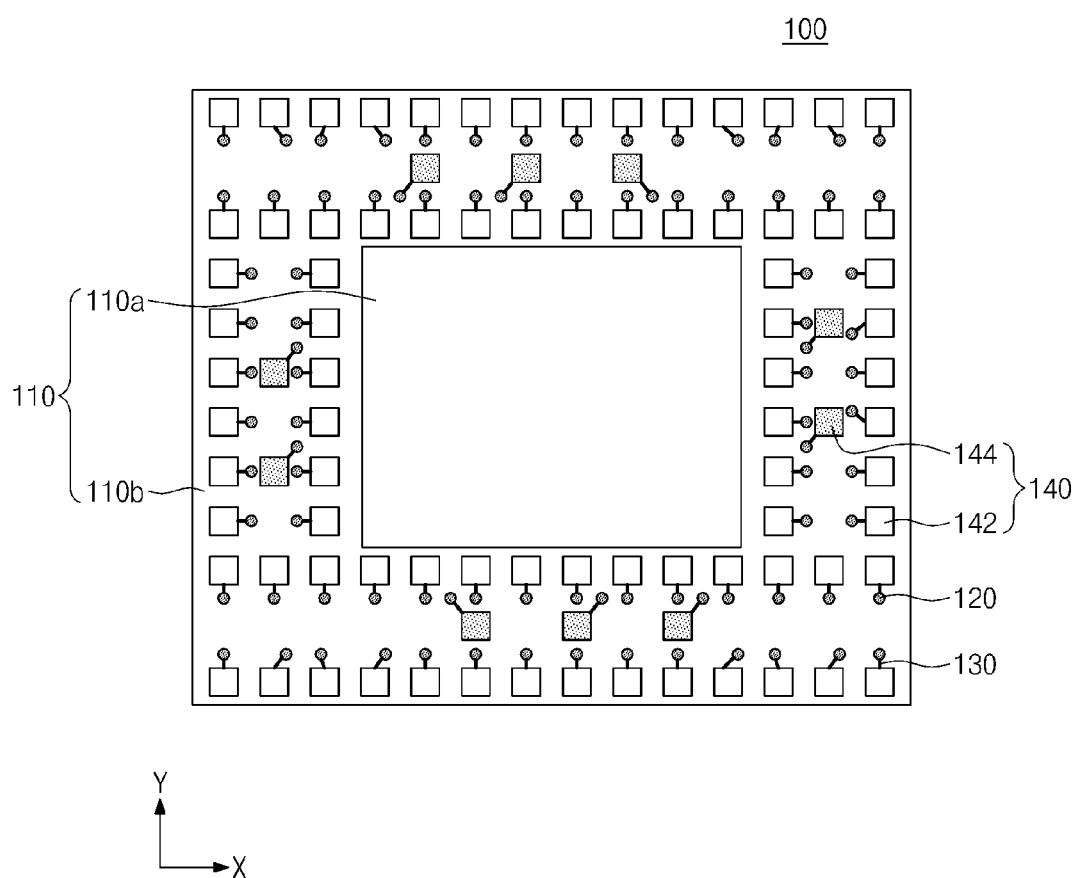
Figure 12B:
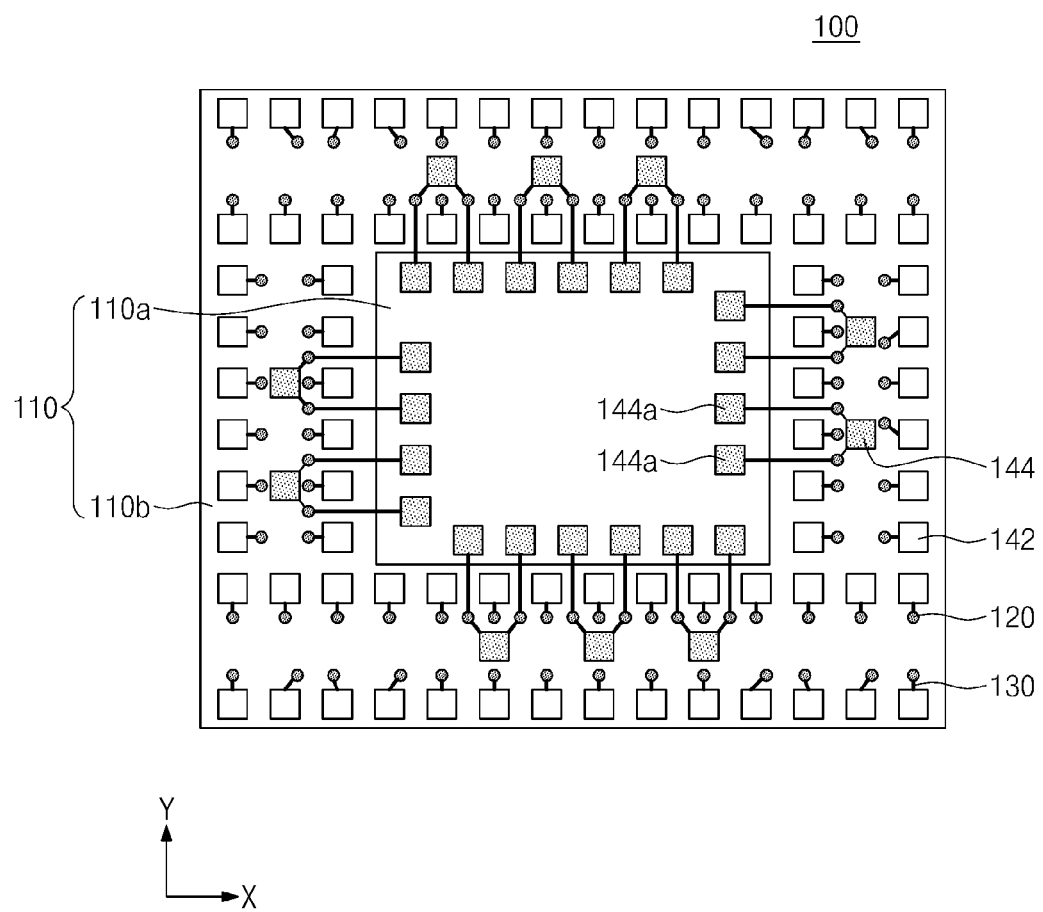

Referring to FIG. 12A, the semiconductor device 100 may include a first region 110a occupying a center region of the semiconductor device 100 and a second region 110b enclosing the first region 110a. For example, the second region 110b may be a substantially ring-shaped region, and the redistribution pads 140 may be disposed on the second region 110b to form a substantially ring-shaped arrangement. As shown in FIG. 12B, in the case where the auxiliary power pads 144a are further provided, the auxiliary power pads 144a may be provided on the first region 110a. Substantially all of the electric pads 120 may be provided on the second region 110b. In example embodiments, substantially all of the electric pads 120 may be provided on the first region 110a, as shown in FIG. 6A. Alternatively, as shown in FIG. 7A or FIG. 8A, some of the electric pads 120 may be provided on the first region 110a, and other electric pads 120 may be provided on the second region 110b.

According to some example embodiments of the inventive concepts, power/ground pads are arranged between rows of input/output pads, and thus, it may be possible to reduce an area occupied by the pads and consequently to reduce a size of a semiconductor device. Accordingly, it may be possible to reduce the size of an electronic product. Furthermore, it may be possible to reduce a wiring length of a redistribution structure between an electric pad and a redistribution pad and thereby to overcome deterioration in electric characteristic of a semiconductor device, which may be caused by an increase of the wiring length.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a plurality of electric pads provided on a semiconductor substrate; and
a plurality of redistribution pads electrically connected to the electric pads and to an outer terminal,
wherein the plurality of redistribution pads include,
a plurality of first redistribution pads forming a first transmission path for a first electrical signal; and
at least one second redistribution pad forming a second transmission path for a second electrical signal different from the first electrical signal,
the plurality of first redistribution pads being on the semiconductor substrate and forming at least two rows, and
the at least one second redistribution pad is on the semiconductor substrate between the at least two rows of the first redistribution pads; and
wherein the plurality of first redistribution pads and the at least one second redistribution pad are on a center region of the semiconductor substrate.

2. The device of claim 1, wherein the semiconductor substrate comprises:
at least two cell regions separated from each other by the center region,
wherein the plurality of first redistribution pads and the at least one second redistribution pad are parallel to an extension direction of the center region.

3. The device of claim 2, wherein the electric pads are provided on the cell region.

4. The device of claim 2, wherein at least one of the electric pads is on the cell region, and at least another one of the electric pads is on the center region.

5. The device of claim 1, wherein the first electrical signal includes an input/output signal, and the second electrical signal includes at least one of a power signal and a ground signal.

6. The device of claim 1, wherein the semiconductor substrate comprises:
a plurality of cell regions at corner regions of the semiconductor substrate; and
a cross-shaped region separating the cell regions from each other,
wherein the first and second redistribution pads are arranged on the cross-shaped region in a parallel direction to a first direction.

7. The device of claim 1, wherein the semiconductor substrate comprises:
at least one peripheral region extending along a parallel direction to a side of the semiconductor substrate at an edge region of the semiconductor substrate adjacent to the side; and
at least one cell region at a remaining region of the semiconductor substrate,
wherein the first and second redistribution pads are arranged on the at least one peripheral region in an extension direction of the at least one peripheral region.

8. The device of claim 1, wherein the semiconductor substrate comprises:
a cell region at about a center of the semiconductor substrate; and
a closed-shaped peripheral region extending along an edge of the semiconductor substrate and enclosing the cell region,
wherein the first and second redistribution pads are arranged on and along the peripheral region and form a closed-shaped arrangement.

9. The device of claim 1, wherein the first electrical signal includes an input/output signal, and the second electrical signal includes at least one of a power signal and a ground signal.

10. The device of claim 1, wherein the plurality of redistribution pads further comprise at least one dummy pad provided on the semiconductor substrate between the at least two rows of the first redistribution pads.

11. A semiconductor device, comprising:
a plurality of electric pads on a semiconductor substrate; and
a plurality of redistribution pads electrically connected to the plurality of electric pads and to an outer terminal,
the plurality of electric pads including,
a plurality of first electric pads forming a first transmission path for a first electrical signal; and
a plurality of second electric pads forming a second transmission path for a second electrical signal, the second electrical signal being different from the first electrical signal,
the plurality of redistribution pads including,
a plurality of first redistribution pads electrically connected to the plurality of first electric pads; and
a plurality of second redistribution pads electrically connected to the plurality of second electric pads,
wherein the first redistribution pads form at least two rows,
wherein one or more of the second redistribution pads are between the at least two rows of the first redistribution pads; and
wherein the plurality of first and second redistribution pads are on a central region of the semiconductor substrate.

12. The device of claim 11, wherein the plurality of redistribution pads further comprise a plurality of auxiliary pads electrically connected to the second redistribution pads.

13. The device of claim 11, wherein the semiconductor substrate comprises at least one cell region and at least one peripheral region, and at least one of,
the first and second redistribution pads are provided on the peripheral region.

14. The device of claim 13, wherein the plurality of redistribution pads further comprise a plurality of auxiliary pads electrically connected to the second redistribution pads,
the auxiliary pads forming the second transmission path for the second electrical signal.

15. A semiconductor device comprising a surface on which a plurality of input/output pads and a plurality of power pads are provided,
wherein the plurality of input/output pads are on the surface of the semiconductor device in a first row and a second row, the first row and the second row being parallel to a first direction,
wherein the plurality of power pads are on the surface of the semiconductor device in a third row that is between the first and second rows and that is parallel to the first direction; and wherein at least one of the plurality of input/output pads and the plurality of power pads are on a central region of the surface of the semiconductor device.

16. The device of claim 15, further comprising at least one auxiliary power pad electrically connected to at least one of the power pads,
wherein the power pad and the at least one auxiliary power pad are electrically connected thereto to form a single pad with substantially the same potential.

17. The device of claim 15, further comprising:
a plurality of electric pads,
wherein at least some of the input/output and power pads are configured as redistribution pads electrically connected to the electric pads and to outer terminals.

18. The device of claim 17, wherein at least one of the plurality of input/output pads and the plurality of power pads has a size that is substantially equal to or larger than a size of the plurality of electric pads.

* * * * *